United States Patent [19]
Bree et al.

[11] Patent Number: 5,444,187
[45] Date of Patent: Aug. 22, 1995

[54] METHOD OF SURFACE MOUNTING RADIO FREQUENCY COMPONENTS AND THE COMPONENTS

[75] Inventors: Daniel R. Bree, Oceanside, Calif.; Rafael Lem, Tijuana, Mexico

[73] Assignee: Baier & Baier, Inc., Dana Point, Calif.

[21] Appl. No.: 329,222

[22] Filed: Oct. 26, 1994

[51] Int. Cl.⁶ .............................................. H05K 1/00
[52] U.S. Cl. .................................. 174/260; 174/261; 361/760
[58] Field of Search .................... 174/250, 260, 261; 361/760; 428/901

Primary Examiner—Leo P. Picard
Assistant Examiner—Cheryl R. Figlin
Attorney, Agent, or Firm—Bernard L. Kleinke; Peter P. Scott

[57] ABSTRACT

The method of surface mounting radio frequency components includes using at least one radio frequency component having a pair of input/output contact points or areas at corners on the underside of the component, wherein each of the input/output contact points or areas abuts the adjoining edges of the corners. The component is positioned relative to a pair of traces on a circuit board for enabling an electrical connection thereto in a range of angular dispositions. By using a single non-customized component, adjacent components can be configured with a signal flow path of a range between about 0° (a chain configuration) and about 180° (a "U"-turn).

13 Claims, 4 Drawing Sheets

METHOD OF SURFACE MOUNTING RADIO FREQUENCY COMPONENTS AND THE COMPONENTS

TECHNICAL FIELD

The present invention relates in general to an improved method for surface mounting radio frequency components, and a radio frequency component for mounting in accordance with the improved mounting method. The invention more particularly relates to a method of surface mounting radio frequency components in a manner which facilitates the placement of the components in close proximity to one another, and which can be accomplished with an improved radio frequency component.

BACKGROUND ART

There have been many methods for the surface mounting of radio frequency components, in particular those components which interact with signals having frequencies between approximately one kilohertz and approximately twenty six gigahertz. An example of such a prior art surface mounting method for radio frequency components required the use of a circuit board having a number of traces thereon in cooperation with components having electronic devices on a carrier. A pair of input/output launch pads, or contact areas, located on the underside surface of the carrier member connected to the electronic devices provide an external connection point to the component.

The prior known method requires the components to be positioned on the circuit board according to a predetermined design. Once positioned, the contact points of the components have been connected to the traces by soldering. The components have been oriented on the circuit board to position the edges of the components preferably at right angles to the traces to avoid unwanted perisitic effects where at least a portion of the high frequency signal can otherwise be lost.

While the prior known surface mounting technique for radio frequency components has served its purpose generally in facilitating the assembly procedure, it has not provided a designer of radio frequency circuits with much flexibility. The lack of flexibility relates to the requirement for customization in the development process. The design of radio frequency circuits is an application specific undertaking. The designer must not only specify the types of electronic devices contained within the component, but also specify the configuration of the board layout for the components for each radio frequency application. The configuration of each one of the components is important, since it is desirable to have a high density clustering of the components on the board to reduce its overall size. As a result, the designer must not only design the layout of the traces on the circuit board, but also design the configuration of the components to be used with the custom designed circuit board.

Efficiency can be increased by the designer by creatively arranging the positions of the components in the layout of the board. However, the customization of each one of the components and the board layout required greatly increases the cost of producing radio frequency devices.

Therefore, it would also be highly desirable to have a new and improved method of surface mounting radio frequency components which does not require, or at least greatly reduces, required customization of the radio frequency components and the associated board layout, and which permits the manufacturing of radio frequency devices in a relatively inexpensive manner.

Another drawback of the conventional surface mounting technique for radio frequency components relates to the layout of the traces used to connect components. Due to the inherent characteristics of radio frequency signals, the traces are positioned on the circuit board in such a manner to eliminate right angle bends therein. Thus, instead of using a simple right angle bend to redirect the course of a trace, designers have resorted to the use of mitered corners and interconnecting trace segments at less severe angles, to achieve a desired circuit within the constraints imposed by the size of the circuit board.

Using mitered bends and other such design restrictions for the traces, the amount of circuit board is undesirably large to accommodate all of the required traces. The result has been an overly large board with a less than desirable density of components.

This inefficient use of the circuit board is even more apparent when bends and turns to the trace are required. For example, a 180° "U"-turn in a trace connecting two parallel chains of radio frequency components, such as filters, requires the dedication of a large area of the circuit board to accommodate a segmented U-shaped trace. Thus, valuable space on the board to accommodate the large U-shaped segmented trace is lost. Also, the U-shaped trace can cause an unwanted and undesirable loss of the radio frequency signal.

Therefore, it would also be highly desirable to have a new and improved method of surface mounting radio frequency components in a more effective manner.

DISCLOSURE OF INVENTION

Therefore, the principal object of the present invention is to provide a new and improved method of surface mounting radio frequency components, and a radio frequency component for use in such a method, to reduce greatly the need for customizing the radio frequency components, to increase component density, and to simplify the board layout design requirements.

Briefly, the above and further objects of the present invention are realized by providing a new and improved method of surface mounting radio frequency components, and a radio frequency component for use therein, to facilitate greatly circuit board layout and to reduce or eliminate entirely the requirement for customized radio frequency components. Such a new and novel method of surface mounting radio frequency components utilizes the circuit board in an efficient manner to enhance the highly desirable high density clustering of components.

The method of surface mounting radio frequency components includes using at least one radio frequency component having a pair of input/output contact points or areas at corners on the underside of the component, wherein each of the input/output contact points or areas abuts the adjoining edges of the corners. The component is positioned relative to a pair of traces on a circuit board for enabling an electrical connection thereto in a range of angular dispositions. By using a single non-customized component, adjacent components can be configured with a signal flow path of a range between about 0° (a chain configuration) and about 180° (a "U"-turn).

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

Figure 1:
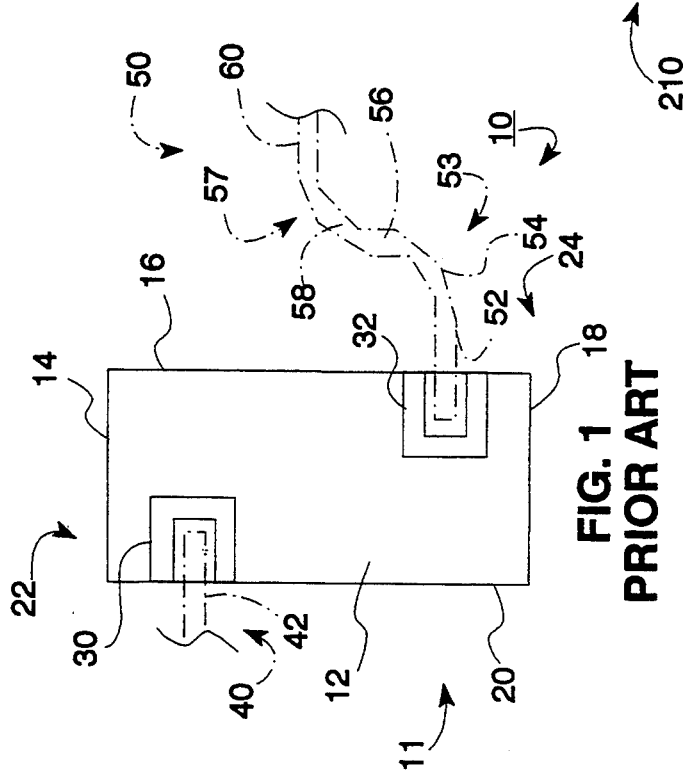
FIG. 1 is a partial diagrammatical view of a portion of a prior art radio frequency circuit, illustrating conventional surface mounting methods.

Referring now to FIG. 1, there is shown a bottom view of a portion of a prior art radio frequency circuit generally indicated at 10, which employs conventional surface mounting techniques according to a prior art method. The circuit 10 includes a conventional radio frequency component 11 having a generally rectangular underside 12 and edges 14, 16, 18 and 20. Edges 14 and 20 intersect at a corner area generally indicated at 22 of the underside 12, and edges 16 and 18 intersect to form a corner area generally indicated at 24 of underside 12.

A pair of input/output contact members 30 and 32 are disposed at the opposite respective side edges 20 and 16 spaced from the respective corner areas 22 and 24 to enable the radio frequency component 11 to be connected electrically to the circuit board.

According to the prior art method of surface mounting the component 11, the radio frequency component 11 is positioned over the circuit board to align the input-/output connection members 30 and 32 with a pair of traces 40 and 50, respectively. In order to reduce interference introduced by the traces 40 and 50, the traces 40 and 50 include connection portion 42 and 52, respectively, which are connected to the input/output connection members 30 and 32 by conventional soldering techniques and which are substantially perpendicular to the adjacent edges 20 and 16, respectively.

It is well known in the art that an improper arrangement of the traces carrying radio frequency signals can cause a loss of the signals. In this regard, traces having sharp turns, such as right angle turns without any mitering or other design considerations, are to be avoided since the adjoining traces can create unwanted perisitic effects in the form of electrical interference. The result of such interference is a signal loss.

To reduce signal losses caused by abrupt turns in the traces, all right angle turns in the course of the segmented trace 50 on a circuit board (not shown) have been eliminated by using angled trace members, such as trace members 54, 56, 58 and 60. In this regard, trace members 52 and 60 are spaced apart from one another, and are substantially parallel, but the intermediate portion of the trace 50 employs an irregular shape due to the segments 54, 56 and 58.

In order to connect trace members 52 and 60 without using a 90° bend, trace member 56 is positioned perpendicular to both trace members 52 and 60. Rather than intersecting trace members 52 and 60 at right angles, trace member 56 is connected to trace members 52 and 60 by angled trace members 54 and 58. In this regard, the angled trace members 54 and 58 form about 45° angles with the trace members 52 and 56, as well as trace members 56 and 60.

The angled trace members 54 and 58 form mitered corners 53 and 57 in the trace 50, thereby eliminating detrimental effects due to sharp turns in the trace. However, the resulting segmented trace 50 extending to an adjacent component (not shown) occupies an undesirably large amount of space on the circuit board (not shown) and thus the resulting component spacing is not very dense. Also, the large segmented traces can produce an undesired loss in signal.

Figure 2:
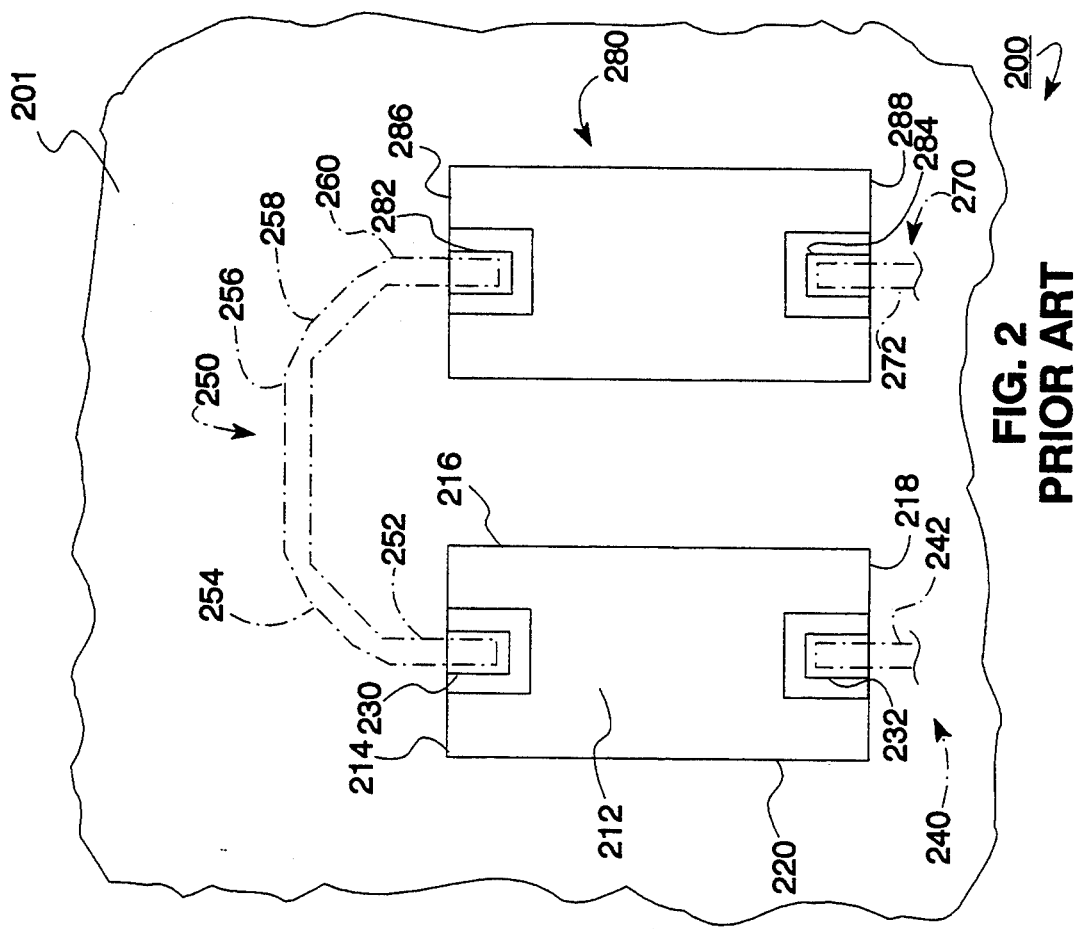
FIG. 2 is a partial diagrammatical view of a portion of another prior art radio frequency circuit, illustrating conventional surface mounting methods.

Referring now to FIG. 2, there is shown another prior art radio frequency circuit 200 which is surface mounted to a circuit board 201 according to a prior art method. The conventional surface mounting method uses a pair of conventional radio frequency components 210 and 280 for mounting on the circuit board 201. As both radio frequency components 210 and 280 are substantially similar to one another, only radio frequency component 210 will now be considered hereinafter in greater detail.

The radio frequency component 210 includes a generally rectangularly shaped underside surface 212 having edges 214, 216, 218 and 220. A pair of input/output connection members 230 and 232 are disposed at opposite edges 214 and 218. The input/output connection members 230 and 232 abut edges 214 and 218, respectively, and are located at about a midpoint thereof. The component 210 is similar to the prior art component 11 (FIG. 1) except that the input/output connection members 230 and 232 have been positioned directly opposite of one another at the end edges of the component. This U-shaped configuration enables components, such as components 210 and 280, to connect a pair of parallel linear chains of components in a 180° signal flow path configuration. In this regard, for example, depending on the polarity, a signal can enter the component 280 at trace 272, flow through the component 280, a segmented U-shaped trace 250, the component 220, and out the trace 242 to complete the 180° flow path turn.

The radio frequency component 210 is positioned relative to traces 240 and 250 to align the input/output connection members 232 and 230 therewith. The component 210 is then mounted to the traces 240 and 250 to connect electrically the input/output connection members 232 and 230 thereto, wherein the traces 240 and 250 form a 90° angle relative to the opposite edges 218 and 214, respectively.

Similarly, the component 280 is positioned relative to the trace 250 and another trace 270 to position the input/output connection members 282 and 284 therewith. The component 280 is then mounted to the circuit board to connect electrically the traces 250 and 270 to the input/output connection members 282 and 284. The traces 250 and 270 form a 90° angle with the opposite edges 286 and 288, respectively. As a result, the components 210 and 280 are mounted to the circuit board in a parallel manner, and are connected to one another by the trace 250.

As discussed previously, all right angles with special mitering or other design considerations in radio frequency traces are to be avoided to eliminate signal losses associated with the sharp turns. Thus, the prior art method of surface mounting components 210 and 280 in parallel was accomplished by eliminating all right angled bends in the trace 250.

In order to eliminate all unwanted right angled bends, the segmented trace 250 was divided into trace numbers 252, 254, 256, 258 and 260. Trace members 252 and 260 are attached to the input/output connection members 230 and 282, respectively, and are substantially parallel to one another. The trace member 256 is positioned perpendicular to the trace members 252 and 260, and is connected thereto by trace members 254 and 258. By angling the trace members 254 and 258 at about a 45° angle from trace members 252, 256 and 260 to form mitered corners, the trace 250 is substantially U-shaped and permits the connection of the components 210 and 280 to one another without the use of a right angled turn.

While the use of mitered corners eliminated right angled bends and rounded turns in connecting the components 210 and 280 to one another with the trace 250, signal losses were still prevalent. The signal losses resulted from the relatively long length of the segmented trace 250 and the per unit length resistance associated with the trace 250. Thus, by increasing the length of the trace 250 by using mitered turns to eliminate interference losses, losses due to resistance have increased.

Furthermore, requiring mitered turns in the segmented trace 250 causes the components 210 and 280 to be spaced further apart from one another in an undesirable manner. This is necessitated by the need to include the angled trace members 254 and 258 which extend in both the x and y coordinates of the plane defined by the circuit board 201. As a result of the components 210 and 280 being spaced further apart, the component density on the circuit board 201 is reduced, thereby reducing the efficient use of available circuit board surface area.

From the foregoing, it is apparent that the prior art components 11, 210 and 280, and the methods of surface mounting them, are restrictive and inefficient. In this regard, all traces connected to the respective input/output connection members must be normal to edges adjacent to the input/output connection members. To deviate from this introduces interference caused by a trace forming an acute angle with the adjacent edge. In addition, the lengths of traces connecting parallel components are increased, thereby increasing the signal losses. Furthermore, the spacing between components is increased. Increasing the space between components requires more surface area of the circuit board to surface mount the components, reducing the efficient utilization of available circuit board surface area.

Figure 3:
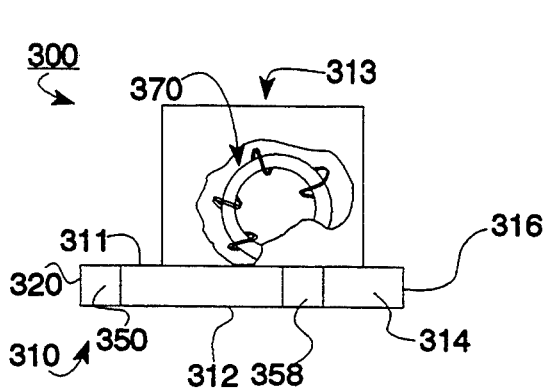
FIG. 3 is a partially diagrammatic, broken away elevational view of a radio frequency component, which is constructed according to the present invention.
Figure 4:
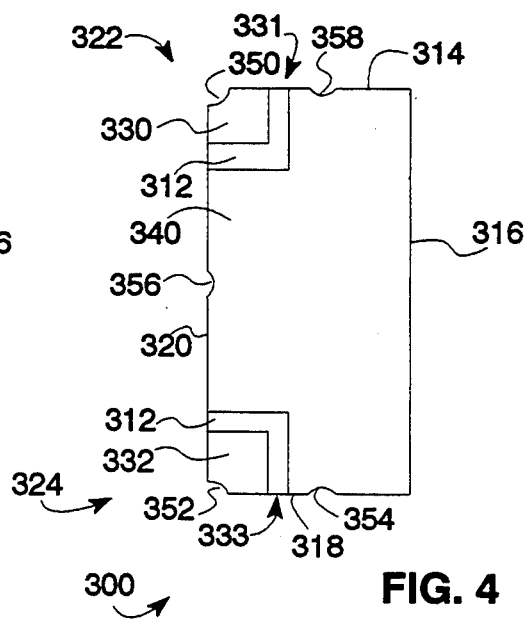
FIG. 4 is an enlarged bottom view of the radio frequency component of FIG. 3.

Referring now to the drawings, and more particularly to FIGS. 3 and 4 thereof, there is shown a radio frequency component 300 which is constructed according to the present invention, and which is surface mounted according to a method of the present invention. The component 300 includes a rectangular carrier portion 310 having an upper surface 311 and an electrically non-conductive underside surface 312. A housing 313 is attached to the upper surface 311 and encloses an electronic device 370 within. It will be understood by one skilled in the art that the radio frequency device 370 could contain a filter, an amplifier, or an oscillator, or any other radio frequency device.

Considering now the carrier member 310 in greater detail with respect to FIG. 4, the carrier member is defined by the edges 314, 316, 318 and 320. Adjoining edges 314 and 320 form a corner portion 322, while adjoining edges 318 and 320 form a corner portion 324. Input/output connection members 330 and 332 are disposed in the corners 322 and 324, respectively, to facilitate the electrical connection of the radio frequency device 370. In this regard, the radio frequency device 370 is connected between the input/output connection members 330 and 332 by a means not shown to permit the device 370 to be activated.

Input/output connection member 330 abuts the edges 314 and 320 and the input/output connection member 332 abuts the edges 318 and 320, wherein the edge 320 is common to both of the input/output connecting members 330 and 332. Also disposed on the underside surface 312, and spaced apart from the input/output connection members 330 and 332 by a pair of gaps 331 and 333, is a base portion 340. The input/output connection members 330 and 332 and the base member 340 are electrically conductive to enable the component 300 to function in a radio frequency circuit (not shown). However, the input/output connection members 330 and 332 are electrically isolated from the base portion 340 on the underside surface 312 due to gaps 331 and 333.

The edges 314, 318 and 320 include semi-circular notches 354, 356 and 358, as well as quarter-radius notches 350 and 352. All of the notches 350, 352, 354, 356 and 358 are half-plated to facilitate post assembly inspection.

Referring now to FIGS. 5-8, a number of methods of surface mounting radio frequency components, such as the radio frequency component 300 illustrated in FIGS. 3 and 4, are illustrated.

Figure 8:
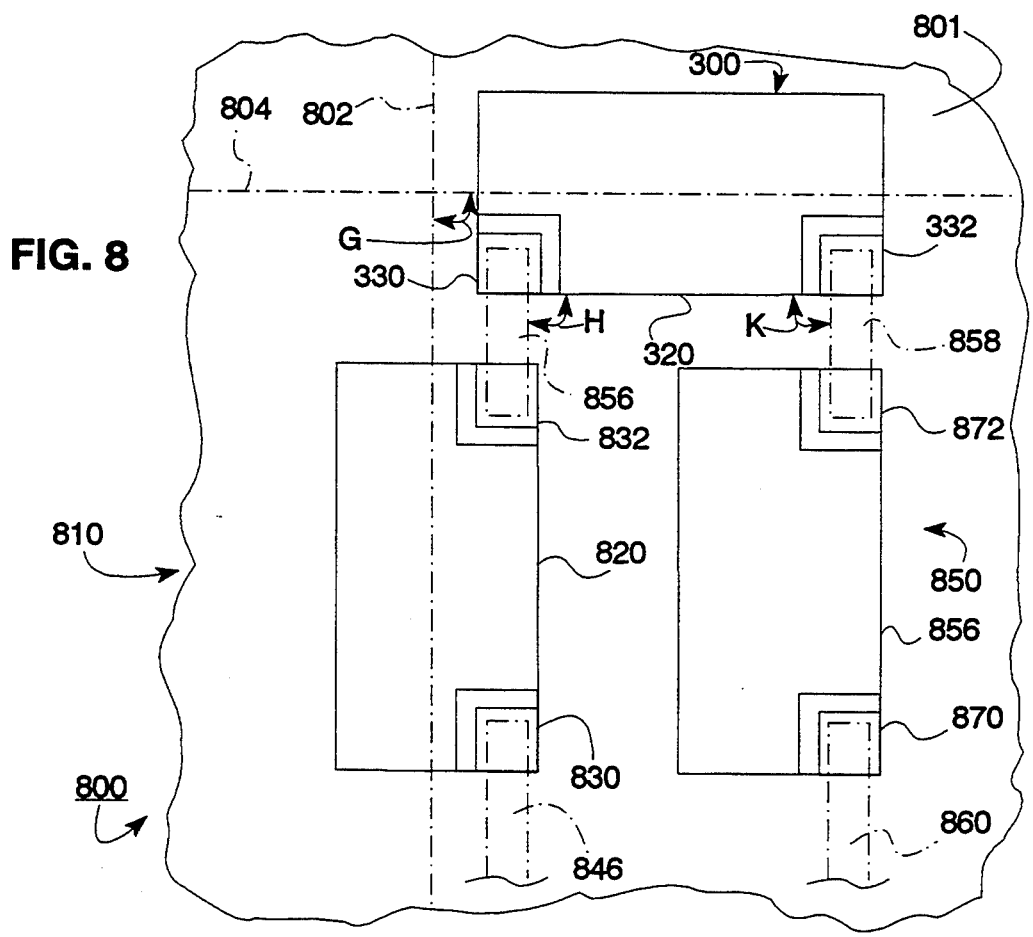
FIG. 8 is a partial diagrammatical view of a further radio frequency circuit, which is also surface mounted according to the method of the present invention to provide a 180° signal flow path turn.

Referring now to FIG. 8, there is shown a radio frequency circuit 800 which is surface mounted according to the present invention. The circuit 800 utilizes three substantially similar components 300, 810 and 850, in connection with a circuit board 801 having traces 846, 856, 858 and 860 thereon.

Using the component 300 of FIGS. 3 and 4, the component 300 is positioned relative to the traces 856 and 858. The input/output connection members 330 and 332 are mounted to the traces 856 and 858, respectively, to complete the electrical connection therebetween. A reference line 804 is indicative of the central axis of the component 300.

Another component 810, having a reference line 802 indicative of the central axis of the component 810, is rotated about an angle G relative to the reference line 804 to orient the component 810 perpendicular to the component 300, wherein the angle G is about 90°. The input/output connection members 830 and 832 are aligned with traces 846 and 856, respectively. The component 810 is mounted to the traces 846 and 856 to electrically connect the input/output connection members 830 and 832 thereto. In this mounted position, the traces 558 and 556 are rotated from a common edge 816, which abuts both the input/output connection members 830 and 832, by the angles K and H, wherein the angles K and H are about 90°.

Similarly, the component 850 includes input/output connection members 870 and 872 and a common edge 856 which abuts both of the input/output connection members 870 and 872. The component 850 is positioned relative to traces 858 and 860, wherein the component 850 is substantially parallel to the component 810. The input/output connection members 870 and 872 are electrically connected to the traces 860 and 858, thereby completing a "U"-turn consisting of the three similar components 300, 810 and 850.

It will be understood by one skilled in the art that the components 300, 810 and 850 occupy approximately the same amount of circuit board space on circuit board 801 that was occupied by the prior art components 210 and 280, connected by the trace 250 on circuit board 201 of FIG. 2. Thus, circuit 800 enables three components to be used in the amount of space where previously only two components could be used.

By surface mounting the three components 300, 810 and 850 in the same amount of space previously used by only two components, the efficient use of the circuit board 801 is significantly increased. Furthermore, by replacing the trace 250 (FIG. 2) with a component, component 300, the losses resulting from the resistance of the trace 250 are eliminated. Therefore, the method of surface mounting according to the present invention permits the mounting of a larger number of components on a fixed amount of surface area, thereby enabling a larger component density on a circuit board, while reducing the signal losses due to trace resistance characteristics.

As described previously, the input/output connection members 330 and 333 (FIGS. 3-8) are disposed at corner surfaces 332 and 334. As a result of the input/output connection members 330 and 332 being located on the corner surfaces 332 and 324, a trace can be connected to the input/output connection members 330 and 332 at a number of angles not possible with the prior art component configuration. For example, the trace may be connected to the input/output connection member 330 at an angle of between about 90° and 180° from the common edge 320 without the trace forming an acute angle with either edge 320 or edge 314.

Considering now the method of surface mounting the radio frequency circuit 500 (FIG. 5), the circuit 500 is surface mounted to a circuit board (not shown) utilizing the radio frequency component 300. The circuit board includes a pair of traces 540 and 550 for connecting electrically the component 300 to other components (not shown).

In operation, the component 300 is positioned relative to the traces 540 and 550 to enable the input/output connection members 330 and 332 to be aligned with the traces 540 and 550. Once aligned, the component 300 is mounted to the circuit board to connect the input/output connection members 330 and 332 to the traces 540 and 550, respectively. The traces 540 and 550 are connected to the input/output connection members 330 and 332 at angles A and B, relative to the common edge 320, wherein the angles A and B are about 90°.

By connecting the traces 540 and 550 at 90° angles to the common edge 320, the component 300 facilitates a 180° change in direction of the flow of a radio frequency signal. For example, the traces 540 and 550 could be connected to a pair of parallel chains of radio frequency components (not shown). The signal transmitted through one of the chains enters the component 300 through one of the traces 540 or 550. The signal passes through the component 300 and is redirected 180° before being transmitted to the other chain of components through the other trace 550 or 540.

Considering now the method of surface mounting the radio frequency circuit 600 (FIG. 6), the circuit 600 utilizes the component 300 in a variation of the circuit 500. In this regard, the method of surface mounting the component 300 requires the component 300 to be positioned relative to traces 640 and 650 of a circuit board (not shown), wherein the input/output connection members 330 and 332 are aligned therewith. The input/output connection members 330 and 332 are mounted to the circuit board to connect electrically the input/output connection members 330 and 332 to the traces 640 and 650, respectively. The traces 650 and 640 are connected to the input/output connection members 330 and 332 at angles C and D relative to the common edge 320, respectively, wherein the angles C and D are about 135°.

The connection of traces 650 and 640 at 135° angles to the common edge 320 enables a pair of chains of components (not shown) to be connected to one another in a manner similar to the circuit 500 of FIG. 1. However, in circuit 600, the component 300 facilitates a 90° change in direction of the flow of the radio frequency signal. Thus, the signal transmitted through one of the traces 650 or 640 to the component 300 flows therethrough, and the signal is redirected 90° before being transmitted to the other chain of components through the other trace 640 or 650.

Considering now the method of surface mounting the circuit 700 (FIG. 7), the circuit 700 is produced using the component 300 in conjunction with a circuit board (not shown) having the traces 750 and 740 thereon. The component 300 is positioned relative to the traces 740 and 750 to align the input/output connection members 330 and 332 therewith. Once positioned, the input/output connection members 330 and 332 are connected to the traces 740 and 750, respectively, to complete the mounting of the component 300. The traces 750 and 740 are connected to the input/output connection members 330 and 332 at angles E and F relative to the common edge 320, respectively, wherein the angles E and F are about 180°.

The connection of traces 750 and 740 at 180° angles to the common edge 320 enables a pair of chains of radio frequency components (not shown) to be connected to one another wherein the flow of the radio frequency signal is not redirected. Instead, the chains of components are co-linear with the component 300. The signal flows from one chain to the component 300, and on to the other chain without changing direction. Thus, the component 300 facilitates a 0° change in direction of signal flow.

Figure 5:
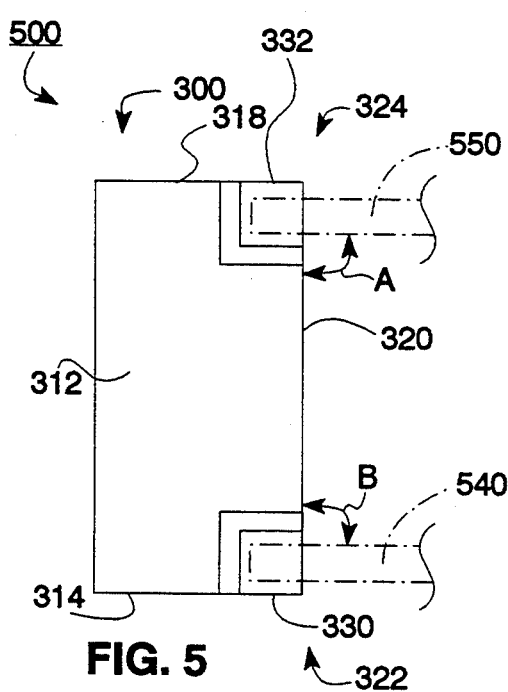
FIG. 5 is a partial diagrammatical view of a radio frequency circuit, including a radio frequency component, which is surface mounted according to the method of the present invention to provide a signal flow path having a 180° turn.
Figure 7:
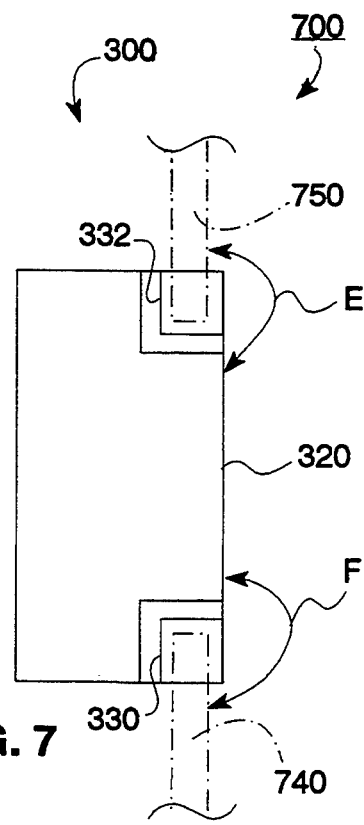
FIG. 7 is a partial diagrammatical view of yet another radio frequency circuit, also utilizing the radio frequency component of FIG. 5, which is also surface mounted according to the method of the present invention to provide a signal flow path having a 0° turn (linear or chain configuration)
Figure 6:
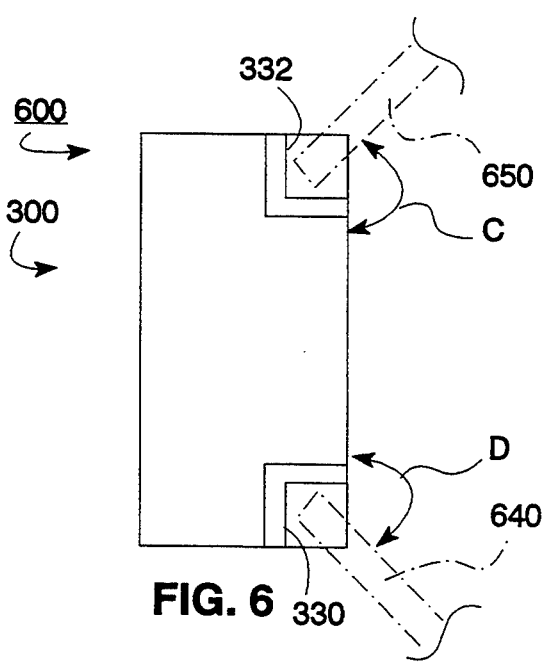
FIG. 6 is a partial diagrammatical view of another radio frequency circuit utilizing the radio frequency component of FIG. 5, which is also surface mounted according to the method of the present invention to provide a signal flow path having a 90° turn.

It will be understood by one skilled in the art that the angles C and D are only representative of an infinite number of possible angles which can be used, and which are in the range bounded by the angles A and B at one end and the angles E and F at the other end. Because of the wide variety of angles permissible, the radio frequency components of the present invention can be utilized in a large variety of radio frequency circuits where the angles between the common edge and the traces vary. Due to the flexibility provided by the method of the present invention, and the inventive radio frequency component used therein, the component 300 facilitates the connection of adjacent components (not shown) in arrangements wherein the angle between the adjacent components can be configured to vary between about 0° (FIG. 7) and about 180° (FIG. 5). Thus, the configuration of a component, such as component 300, may be utilized in a large number of circuits. In this way, a designer can rely on a single component's configuration to satisfy a large number of circuit design requirements. The flexibility available is increased by using components, such as component 300, in chains to form the desired circuit. In this way, the flexibility provided by each one of the components provides the designer with an unlimited amount of design options to optimize the use of available circuit board surface area.

Furthermore, the use of a common component configuration for completing a circuit reduces the cost of surface mounting the components. When using the common component, the component can be specified as an off-the-shelf item, reducing the cost of the method of the present invention.

Figure 9:
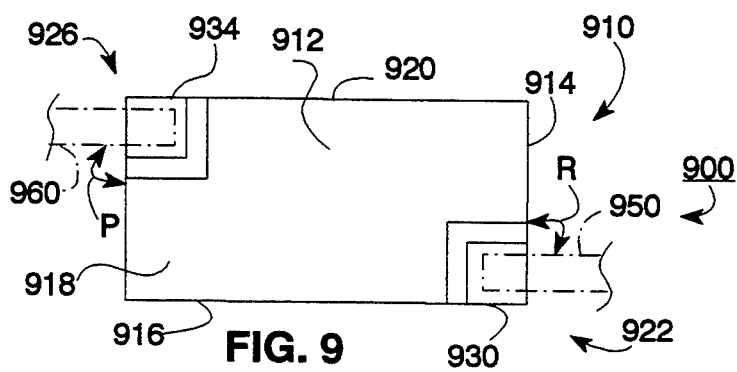
FIG. 9 is a partial diagrammatical view of another radio frequency circuit, and another radio frequency component, which is also surface mounted according to the present invention.

The previously described components 300, 810 and 850, which are all constructed according to the present invention, provide a designer with the flexibility to create a large number of radio frequency circuits. In order to provide additional flexibility, a component 910 (FIG. 9) is contemplated. The component 910 is substantially similar to the components 300, 810 and 850, except that the input/output connection members 930 and 934 are positioned in opposite corner locations 922 and 926. The corner surfaces 922 and 926 are formed by the adjoining edges 914 and 915, and 912 and 918, respectively. In this regard, the edges 914 and 918 are about parallel to one another.

Considering now the method of surface mounting circuit 900, the component 910 is positioned relative to a pair of traces 950 and 960. The component 910 then is mounted to the traces 950 and 960. In this mounted position, the input/output connection members 930 and 934 are electrically connected to the traces 950 and 960 and the traces 950 and 960 are rotated from the opposite edges 914 and 918 by angles R and P, respectively, wherein R and P are about 90°.

The angles R and P can be adjusted to be between about 90° and about 180°. In this way, the traces always form an acute angle with any of the edges 912, 914, 916 or 918. Thus, the losses associated with a trace making an acute angle with an edge are eliminated.

Figure 10:
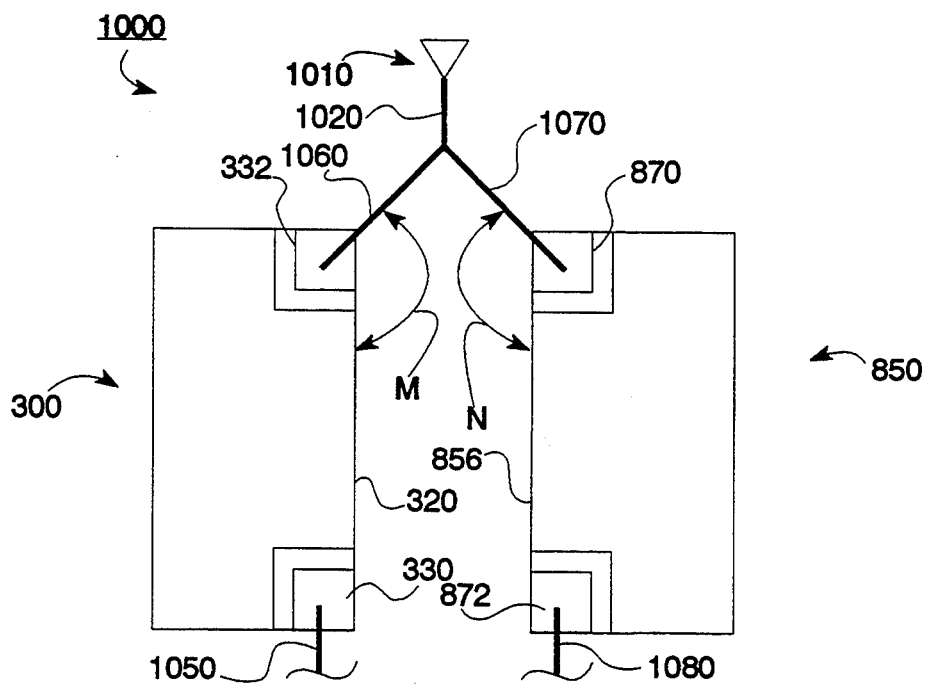
FIG. 10 a partial diagrammatical view of another radio frequency circuit, which is also surface mounted according to the method of the present invention.

Referring now to FIG. 10, there is shown another radio frequency circuit 1000. The circuit 1000 includes an antenna device 1010 which is connected simultaneously to the radio frequency components 300 and 850 in a diplexing or multiplexing configuration.

The component 300 is positioned relative to a pair of traces 1050 and 1060. Similarly, the component 850 is positioned relative to a pair of traces 1070 and 1080. The component 850 is rotated about 180° from the orientation of the component 300, wherein the input/output connection members 870 and 872 are spaced apart from the input/output connection members 332 and 330, respectively.

The components 300 and 850 are mounted to the traces 1050, 1060, 1070 and 1080, connecting the input/output connection members 330, 332, 870 and 872 thereto. The traces 1060 and 1070 are rotated from the common edges 320 and 856 by angles M and N. The angles M and N are about 135°. It will be understood by one skilled in the art that the angles M and N may vary between about 90° and about 150°. The traces 1060 and 1070 terminate at a trace 1020, which is in turn connected to the antenna device 1010 to transmit a radio frequency signal received by the antenna device 1010 to the components 300 and 850.

Figure 11:
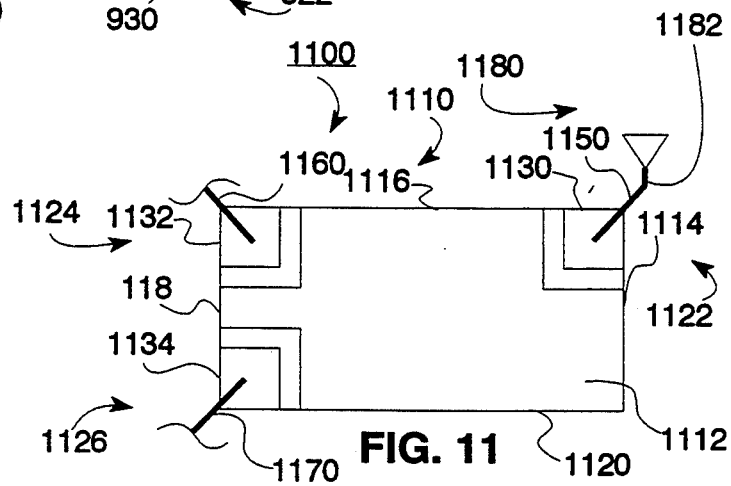
FIG. 11 is a partial diagrammatical view of yet another radio frequency circuit, and yet another radio frequency component for use therein, which is also surface mounted according to the method of the present invention.

Referring now to FIG. 11, there is shown another embodiment of a radio frequency circuit 1100, which is also surface mounted according to the present invention. The circuit 1100 includes a radio frequency component 1110 which includes three input/output connection members 1130, 1132 and 1134, located on three corner surfaces 1122, 1124 and 1126 on the undersurface 1112. The input/output connection members 1130 and 1132 abut in edge 1116 while the input/output connection members 1132 and 1134 abut an edge 1118.

The component 1110 is positioned relative to three traces 1150, 1160, and 1170. The input/output connection members 1130, 1132 and 1134 are connected to the traces 1150, 1160 and 1170. An antenna device 1180 is connected to a trace 1182 and the trace 1182 is electrically connected to the trace 1150 to provide a radio frequency signal to the component 1110.

From the foregoing, one skilled in the art will understand that a large variety of radio frequency circuits can be constructed using a number of similarly configured radio frequency components. Other radio frequency components having slightly different configurations can be used to accommodate a particular need, such as the input of a remote signal. In this way, the basic building blocks available to a designer of radio frequency circuits are substantially similar, thereby reducing the design time of each radio frequency circuit. Furthermore, the variety of radio frequency components for any number of possible circuit design is substantially reduced enabling the components to be more readily available.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A method of surface mounting radio frequency components to a circuit board, comprising:

using at least one rectangular surface mounting component having a pair of input/output connection members disposed at a pair of adjacent corner surfaces on the underside of said component, each of said input/output connection members abuts adjoining edges of said corner surfaces, wherein said input/output connection members abut a common edge;

using a circuit board having a plurality of traces disposed thereon;

positioning said component relative to a first trace and a second trace to align said input/output connection members with said first trace and said second trace; and mounting said component to said circuit board, wherein said input/output connection members are connected electrically to said first trace and said second trace, each one of said traces intersects said common edge at an angle between about 90° and about 180°.

2. A method according to claim 1, further comprising:

using another of said surface mounting components;

rotating said another surface mounting component about 90° from the orientation of said surface mounting component;

positioning said another surface mounting component relative to said second trace and a third trace, wherein said second trace is substantially straight; and mounting said another surface mounting component to said circuit board, wherein said input/output connection members of said another surface mounting component are connected electrically to said second trace and said third trace, said second trace and said third trace intersecting said common edge of said another surface mounting component at an angle between about 90° and about 180°.

3. A method according to claim 1, further comprising:

using a second surface mounting component;

rotating said second surface mounting component between about 0° and about 180° from the orientation of said surface mounting component;

positioning said second surface mounting component relative to a third trace and a fourth trace to align said input/output connection members of said second surface mounting component with said third trace and said fourth trace;

mounting said second surface mounting component to said circuit board, wherein said input/output connection members of said second surface mounting component are connected electrically to said third trace and said fourth trace, said third trace and said fourth trace each intersecting said common edge of said second surface mounting component at an angle of between about 90° and about 180°; and connecting electrically said second trace and said third trace without using mitered turns.

4. A method according to claim 3, further comprising:

using a third surface mounting component;

rotating said third surface mounting component about 90° from the orientation of said surface mounting component;

positioning said third surface mounting component relative to said second trace and said third trace, wherein said second trace and said third trace are substantially straight; and mounting said third surface mounting component to said circuit board, wherein said input/output connection members of said third surface mounting component are connected electrically to said second trace and said third trace, said second trace and said third trace each intersecting said common edge of said third surface mounting component at an angle of between about 90° and about 180°.

5. A method of surface mounting radio frequency components to a circuit board, comprising:

using at least one rectangular surface mounting component having a first input/output connection member, a second input/output connection member and a third input/output connection member disposed at three corner surfaces on the underside of said component, each of said input/output connection members abuts adjoining edges of said corner surfaces, wherein said first and said second input/output connection members abut a common edge, and said second and said third input/output connection members abut another common edge;

using a circuit board having a first, a second and a third trace disposed thereon;

positioning said component relative to said first, said second and said third trace, wherein said first input/output connection member is aligned with said first trace, said second input/output connection member is aligned with said second trace and said third input/output connection member is aligned with said third trace; and mounting said component to said circuit board, wherein said first, said second and said third input/output connection members are connected electrically to said first, said second and said third traces, respectively, said first trace and said second trace each intersecting said common edge at an angle of between about 90° and about 180°.

6. A method according to claim 5, further comprising:

using an antenna means;

connecting electrically said antenna means to said third trace to provide a signal to said component.

7. A method according to claim 3, further comprising:

rotating said second surface mounting component about 180° from the orientation of said surface mounting component;

positioning said second surface mounting component relative to a third trace and a fourth trace to align said input/output connection members of said second surface mounting component with said third trace and said fourth trace;

mounting said second surface mounting component to said circuit board, wherein said input/output connection members of said second surface mounting component are connected electrically to said third trace and said fourth trace, said third trace and said fourth trace each intersecting said common edge of said second surface mounting component at an angle of between about 90° and about 180°;

connecting electrically said second trace to said third trace, wherein said second and said third trace are substantially straight; and connecting an antenna means at about the intersection of said second trace and said third trace to provide a signal to said component and said second component.

8. A radio frequency component for facilitating the mounting thereof on a circuit board, comprising:
at least two traces disposed on said circuit board;
a rectangular carrier member including an underside having a pair of input/output connection members disposed at adjacent corner surfaces of said underside for enabling the electrical connection of said carrier member to said traces, each of said input/output connection members abuts adjoining edges of said corner surfaces, wherein said input/output connection members abut a common edge; and
wherein each one of said traces intersects said common edge at an angle of between about 90° and about 180°.

9. A radio frequency component according to claim 8, wherein each of said traces intersects said common edge at an angle of between about 105° and about 165°.

10. A radio frequency component according to claim 8, wherein each of said traces intersects said common edge at an angle of between about 120° and about 150°.

11. A radio frequency component according to claim 8, wherein each of said traces intersects said common edge at an angle of about 135°.

12. A radio frequency component according to claim 8, further comprising:
another input/output connection member disposed on another corner surface for enabling said carrier member to be connected electrically to a third trace, wherein said another input/output connection member abuts adjoining edges of said another corner surface.

13. A radio frequency component for facilitating the mounting thereof on to a system board, comprising:
at least two traces disposed on said circuit board;
a rectangular carrier member including an underside having a pair of input/output connection members disposed at opposite corner surfaces of said underside for enabling the electrical connection of said carrier member to said traces, each of said input/output connection members abuts adjoining edges of said corner surfaces, wherein said input/output connection members abut oppositely disposed edges; and
wherein each one of said traces intersects said opposite edges at an angle of between about 90° and about 180°.

* * * * *